United States Patent
Tatsumura

(10) Patent No.: US 9,530,502 B2
(45) Date of Patent: Dec. 27, 2016

(54) CONFIGURATION MEMORY STORING DATA BY INJECTING CARRIERS IN GATE INSULATING LAYER OF MISFET

(71) Applicant: KABUSHIKI KAISHA TOSHIBA, Tokyo (JP)

(72) Inventor: Kosuke Tatsumura, Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/661,631

(22) Filed: Mar. 18, 2015

(65) Prior Publication Data

US 2015/0269972 A1 Sep. 24, 2015

(30) Foreign Application Priority Data

Mar. 20, 2014 (JP) .................... 2014-058812

(51) Int. Cl.

| | |
|---|---|
| *G11C 16/04* | (2006.01) |
| *G11C 16/10* | (2006.01) |
| *G11C 7/06* | (2006.01) |
| *G11C 16/26* | (2006.01) |
| *H03K 19/177* | (2006.01) |
| *H01L 27/11* | (2006.01) |
| *H01L 27/105* | (2006.01) |

(Continued)

(52) U.S. Cl.
CPC ........... *G11C 16/0441* (2013.01); *G11C 7/065* (2013.01); *G11C 16/0466* (2013.01); *G11C 16/0483* (2013.01); *G11C 16/10* (2013.01); *G11C 16/26* (2013.01); *H03K 19/1776* (2013.01); *G11C 7/18* (2013.01); *G11C 2207/00* (2013.01); *G11C 2207/005* (2013.01); *H01L 27/1052* (2013.01); *H01L 27/1104* (2013.01); *H01L 27/11563* (2013.01)

(58) Field of Classification Search
CPC ............................ G11C 16/0441; G11C 16/10
See application file for complete search history.

(56) References Cited

U.S. PATENT DOCUMENTS

| | | | | |
|---|---|---|---|---|
| 6,141,247 A | * | 10/2000 | Roohparvar | ........... G11C 14/00 365/185.08 |
| 7,193,437 B2 | | 3/2007 | Cappelli et al. | |

(Continued)

FOREIGN PATENT DOCUMENTS

| | | |
|---|---|---|
| JP | 6-76582 | 3/1994 |
| JP | 2006-127737 | 5/2006 |

(Continued)

*Primary Examiner* — Vanthu Nguyen
(74) *Attorney, Agent, or Firm* — Finnegan, Henderson, Farabow, Garrett & Dunner, LLP

(57) ABSTRACT

A configuration memory includes: memory cell including first and second MISFETs, each of the first and second MISFETs having a gate insulating layer, a source, a drain, and a gate, one of the source and the drain of the first MISFET being connected to a first bit line, the gate of the first MISFET being connected to a first word line, one of the source and the drain of the second MISFET being connected to a second bit line, the gate of the second MISFET being connected to the first word line; a sense amplifier having an output terminal and connected to the first and second bit lines; and a control circuit which is configured to write data in the memory cell by injecting carriers in the gate insulating layer of the first MISFET.

3 Claims, 16 Drawing Sheets

(51) Int. Cl.
*H01L 27/115* (2006.01)
*G11C 7/18* (2006.01)

(56) References Cited

U.S. PATENT DOCUMENTS

| | | |
|---|---|---|
| 7,804,730 B2 | 9/2010 | Redgrave et al. |
| 2006/0092701 A1 | 5/2006 | Horiuchi |
| 2006/0244099 A1 | 11/2006 | Kurjanowicz |
| 2007/0165441 A1 | 7/2007 | Kurjanowicz et al. |
| 2007/0257331 A1 | 11/2007 | Kurjanowicz et al. |
| 2011/0267883 A1* | 11/2011 | Lee .............. G11C 16/045 365/185.08 |
| 2012/0033495 A1* | 2/2012 | Kato .............. G11C 16/344 365/185.05 |
| 2012/0182782 A1 | 7/2012 | Kurjanowicz et al. |
| 2013/0059238 A1 | 3/2013 | Kurjanowicz |
| 2013/0258782 A1 | 10/2013 | Tatsumura et al. |
| 2014/0209989 A1 | 7/2014 | Kurjanowicz |

FOREIGN PATENT DOCUMENTS

| | | |
|---|---|---|
| JP | 2013-80558 | 5/2013 |
| JP | 2013-206509 | 10/2013 |
| JP | 2015-26998 | 2/2015 |

\* cited by examiner

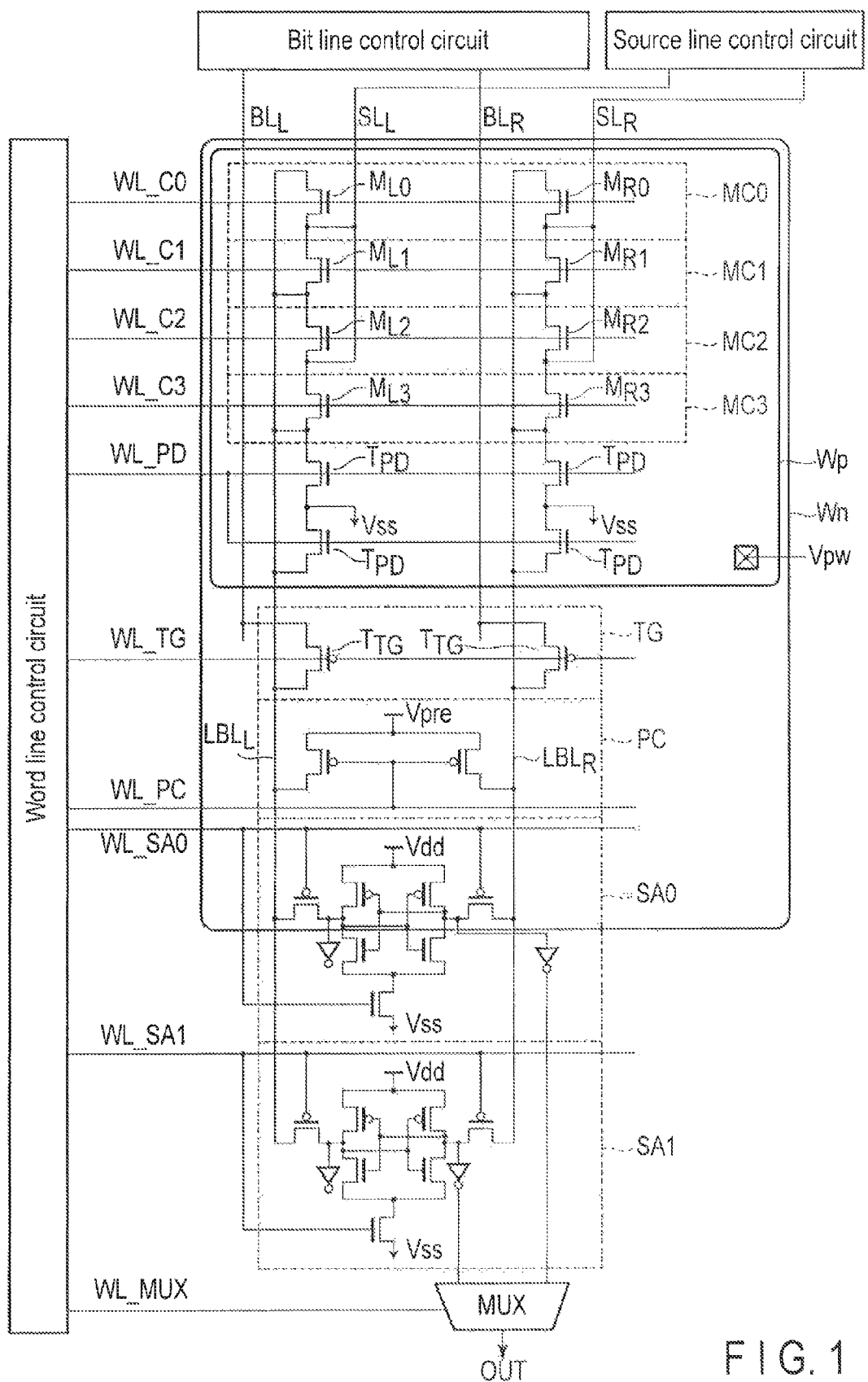
F I G. 1

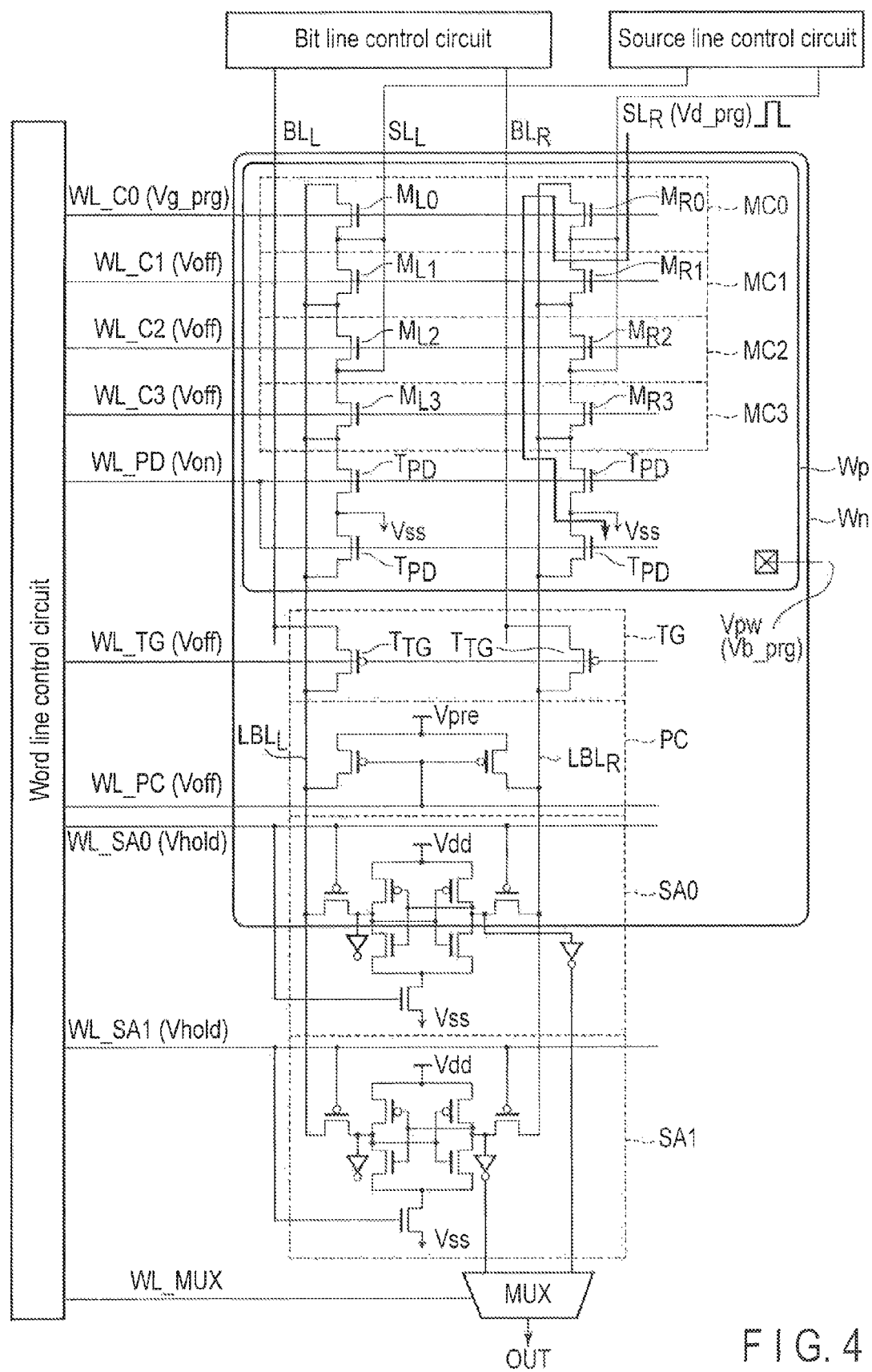
F I G. 4

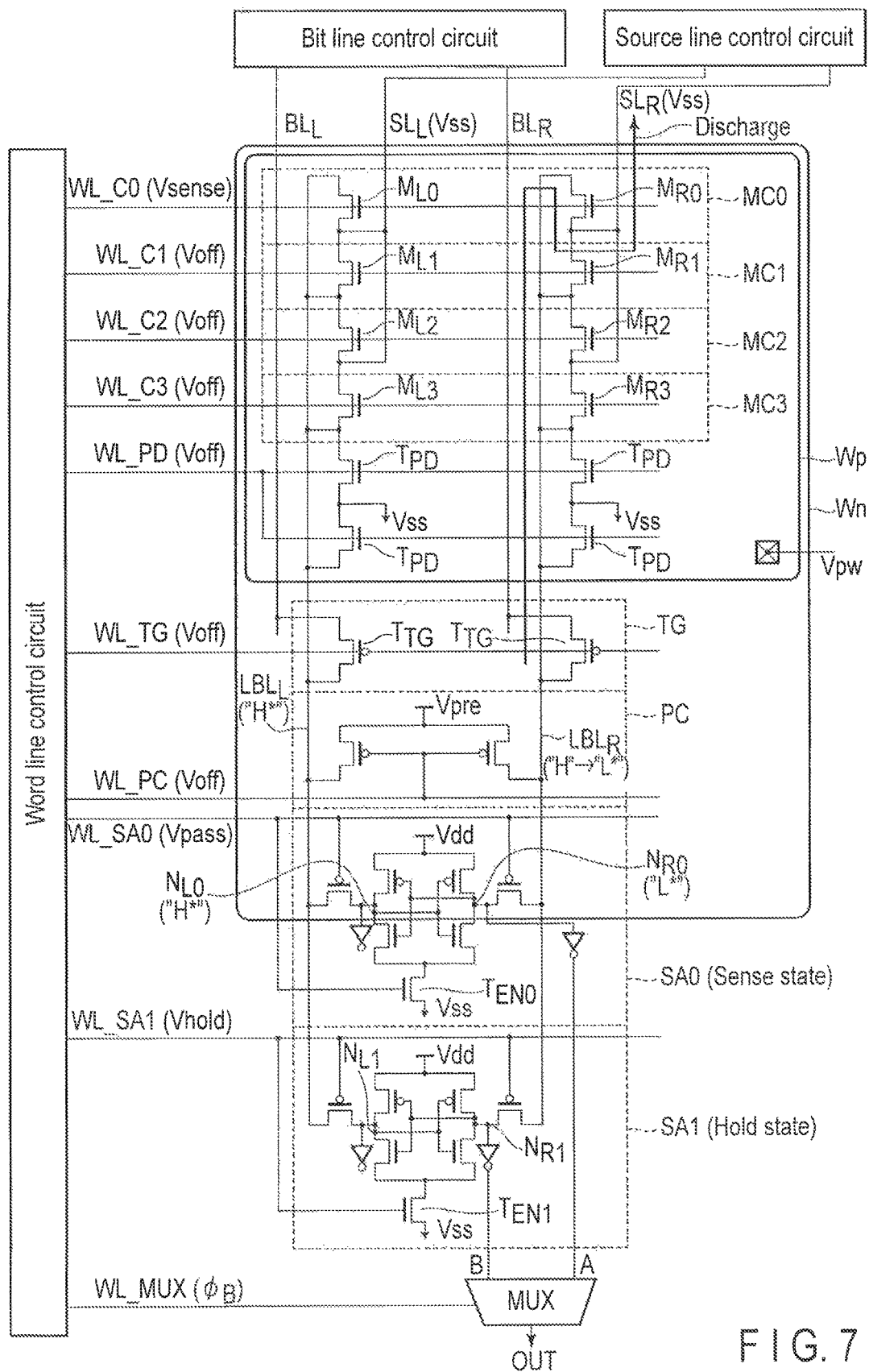
F I G. 7

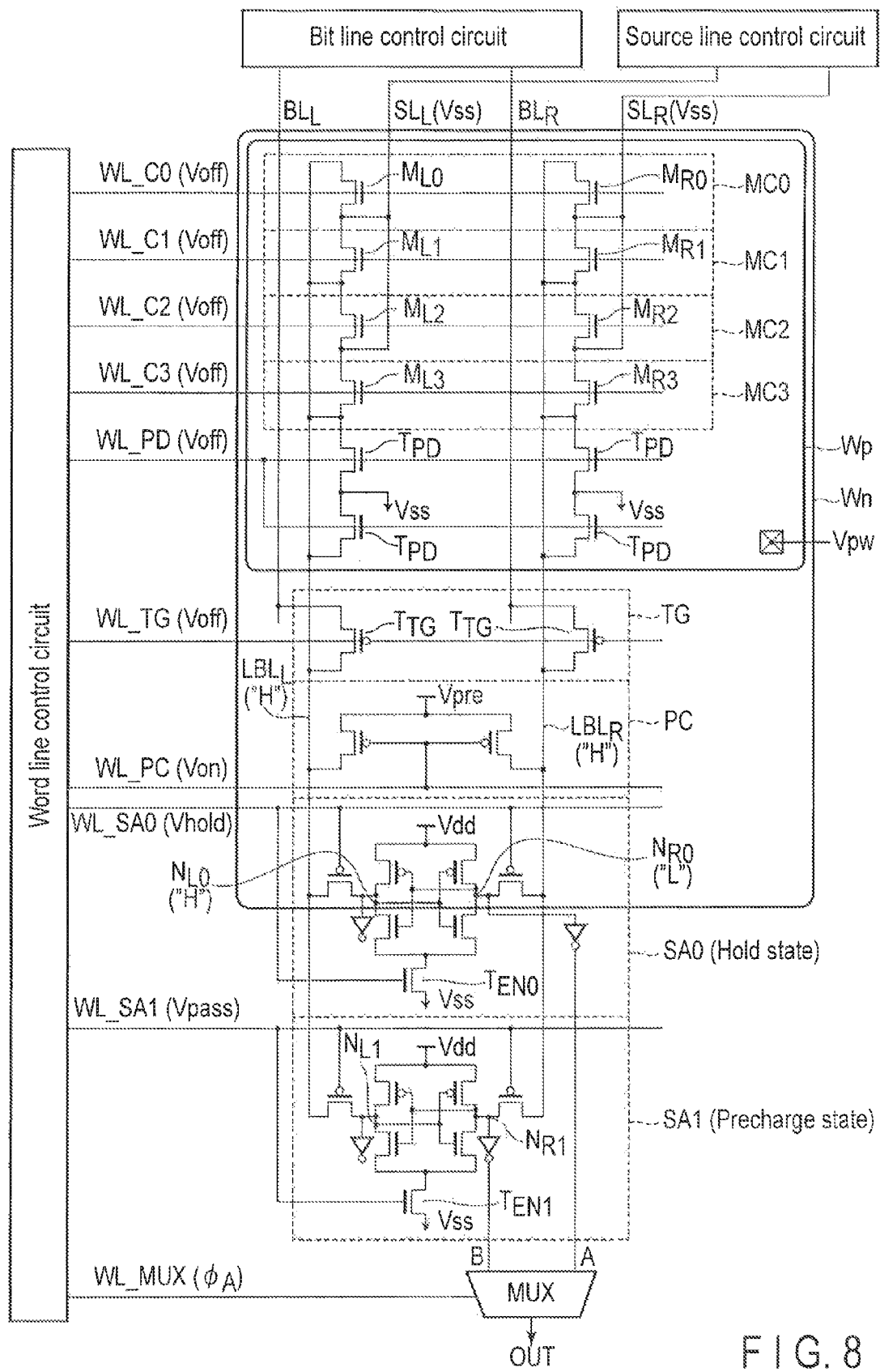
F I G. 8

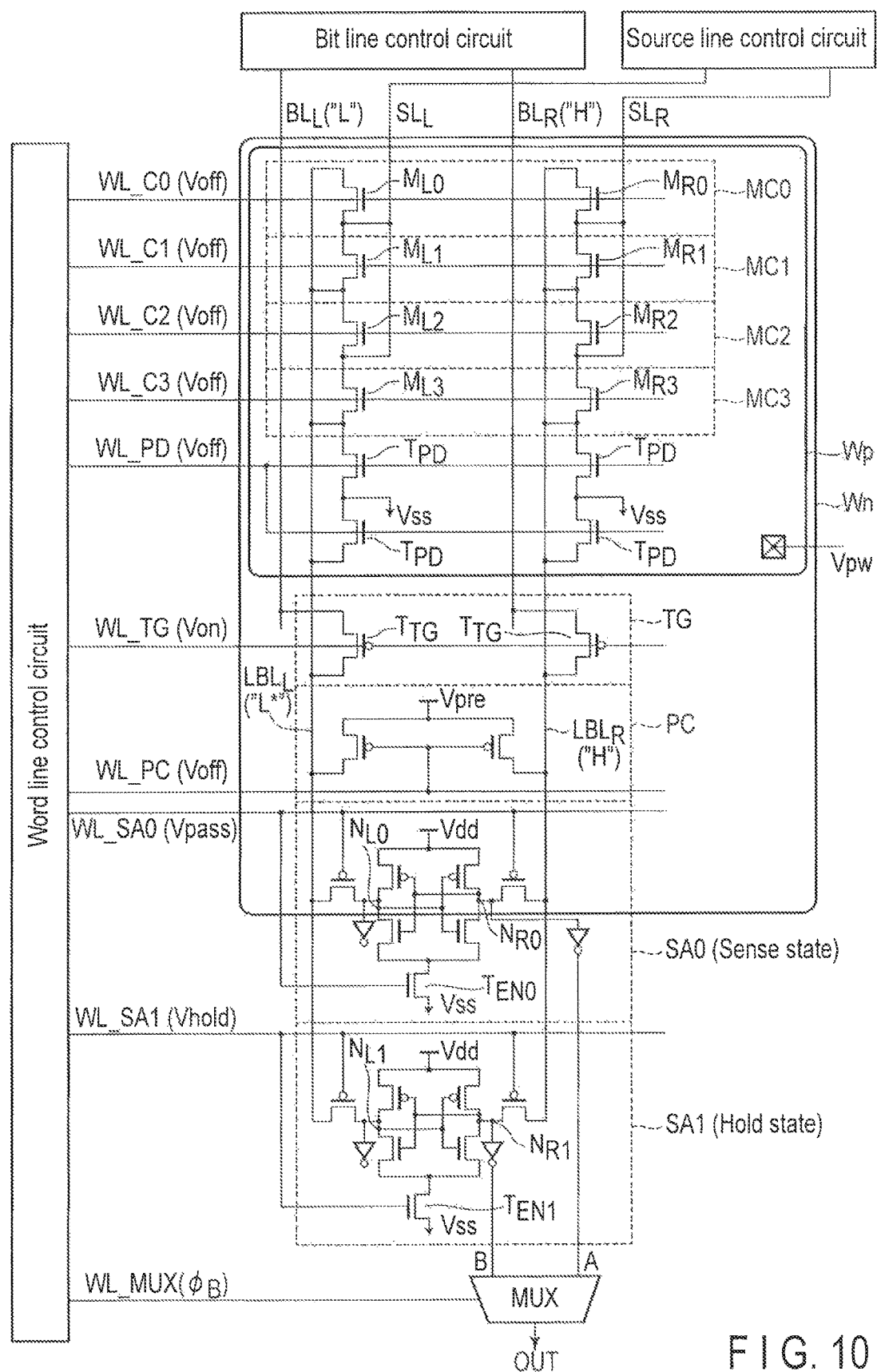
F I G. 10

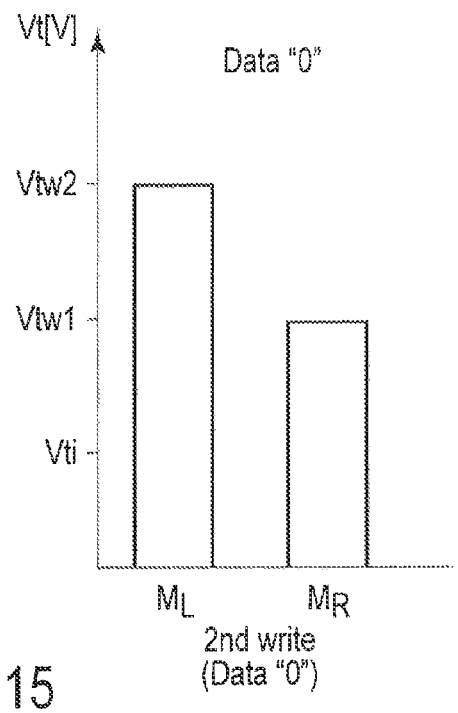
F I G. 15
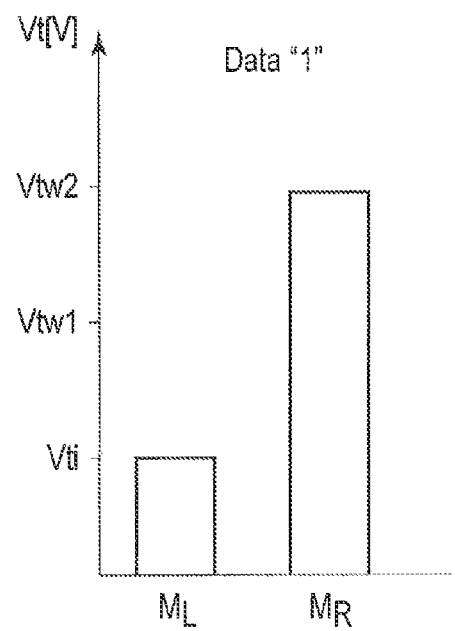
F I G. 16

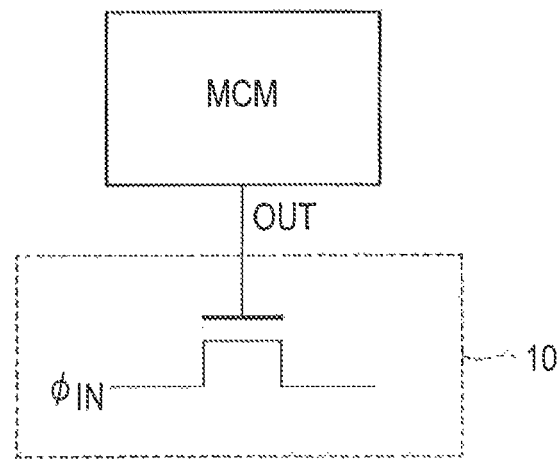
F I G. 17
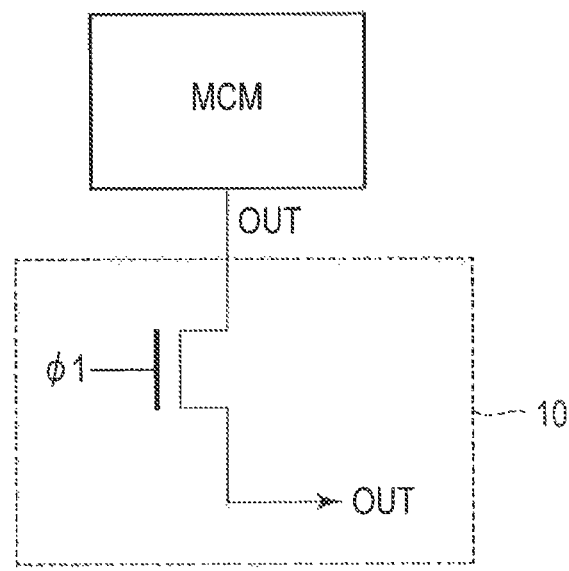
F I G. 18

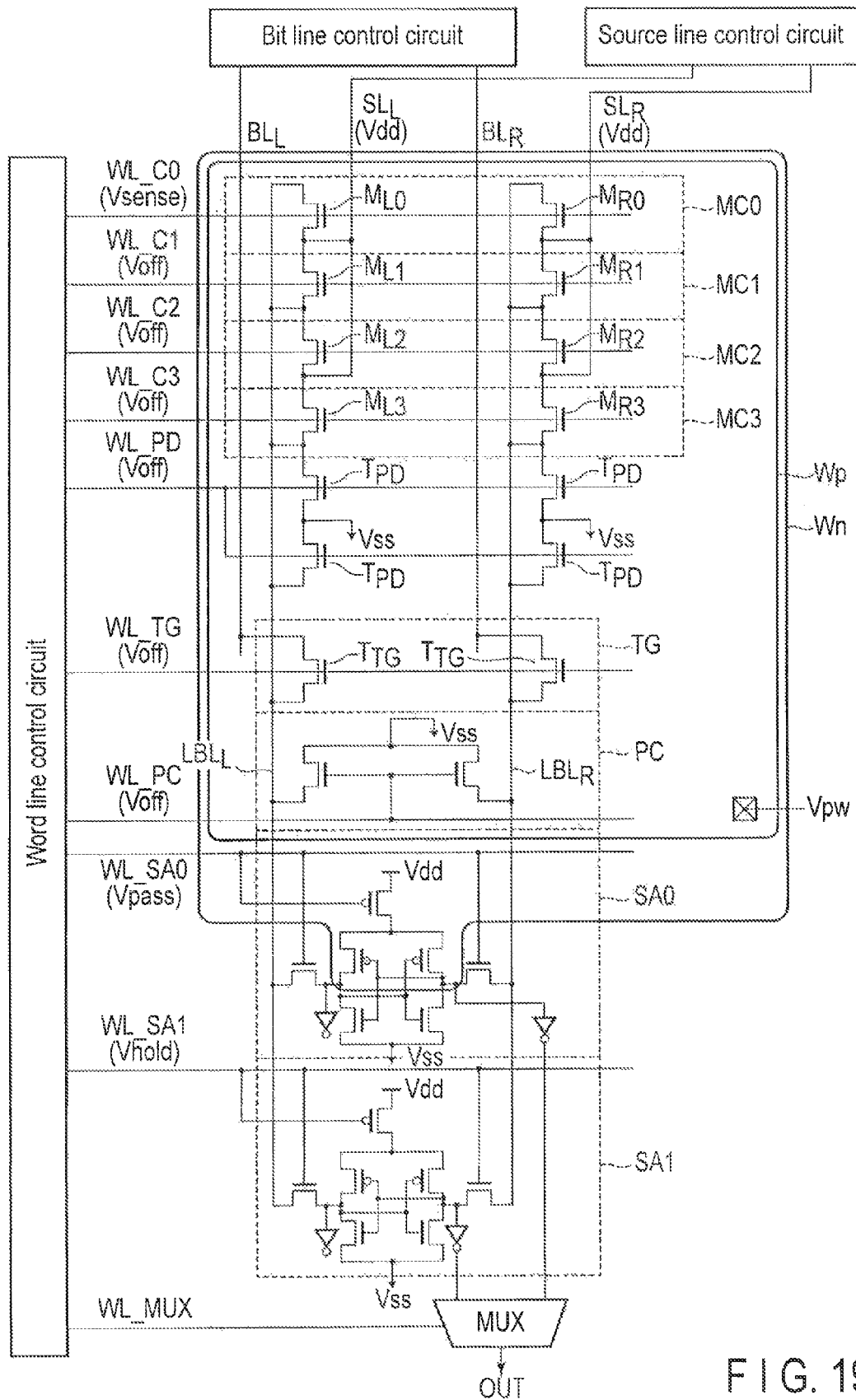
F I G. 19

CONFIGURATION MEMORY STORING DATA BY INJECTING CARRIERS IN GATE INSULATING LAYER OF MISFET

CROSS-REFERENCE TO RELATED APPLICATIONS

This application is based upon and claims the benefit of priority from Japanese Patent Application No. 2014-058812, filed Mar. 20, 2014, the entire contents of which are incorporated herein by reference.

FIELD

Embodiments described herein relate generally to a configuration memory.

BACKGROUND

A reconfigurable logic circuit typified by a field programmable gate array (FPGA) achieves a predetermined logic (circuit configuration) based on data stored in a configuration memory.

A multi-context configuration memory (MCM) comprises a plurality of memory cells and a single output terminal, and outputs therefrom data held in a selected one of the plurality of memory cells. There is a case where a reconfigurable logic circuit provided with the MCM is referred to as a multi-context device. It can store a plurality of circuit configuration information, and switch a circuit configuration in accordance with a context switching signal. The multi-context device can further increase a utilization efficiency of a logic circuit portion, as the number of contexts to be stored increases.

Memory cells in the MCM each comprise, e.g., a static random access memory (SRAM). Since the SRAM includes six transistors, its cell area is relatively large. In this case, if the number of contexts is increased, the area of the MCM is rapidly increased. It is therefore hard to increase the number of contexts. Furthermore, since the SRAM is volatile, data stored in the configuration memory is lost when a power supply turns off. Thus, it is impossible to apply a technique in which in a standby mode, a power supply turns off in order to lower the power consumption.

Furthermore, a nonvolatile memory is known which has a circuit configuration similar to that of an SRAM, and uses a method of modulating a threshold voltage due to a channel hot electron injection. This nonvolatile memory comprises at least six transistors, and thus has a relatively large cell area as in the SRAM.

Therefore, even if the nonvolatile memory is applied to an MCM, it is not possible to solve a problem in which the area of the MCM is rapidly increased as the number of contexts is increased.

In view of the above circumferences, it is hoped that an MCM having a small cell area and including nonvolatile memory cells will be developed.

BRIEF DESCRIPTION OF THE DRAWINGS

FIG. 1 is a circuit diagram of a configuration memory according to a first embodiment;

FIG. 4 is a circuit diagram for explaining a write operation on a memory cell according to a third embodiment;

FIGS. 6-8 are circuit diagrams for explaining a read operation according to a fourth embodiment;

FIGS. 10 and 11 are circuit diagrams for explaining a write operation on a sense amplifier according to a fifth embodiment;

FIGS. 13-16 are views for explaining a rewrite operation for cell data in a seventh embodiment;

FIGS. 17 and 18 are views showing examples of a programmable switch; and

FIG. 19 is a circuit diagram for explaining a modification of the read operation.

DETAILED DESCRIPTION

Figure 2:
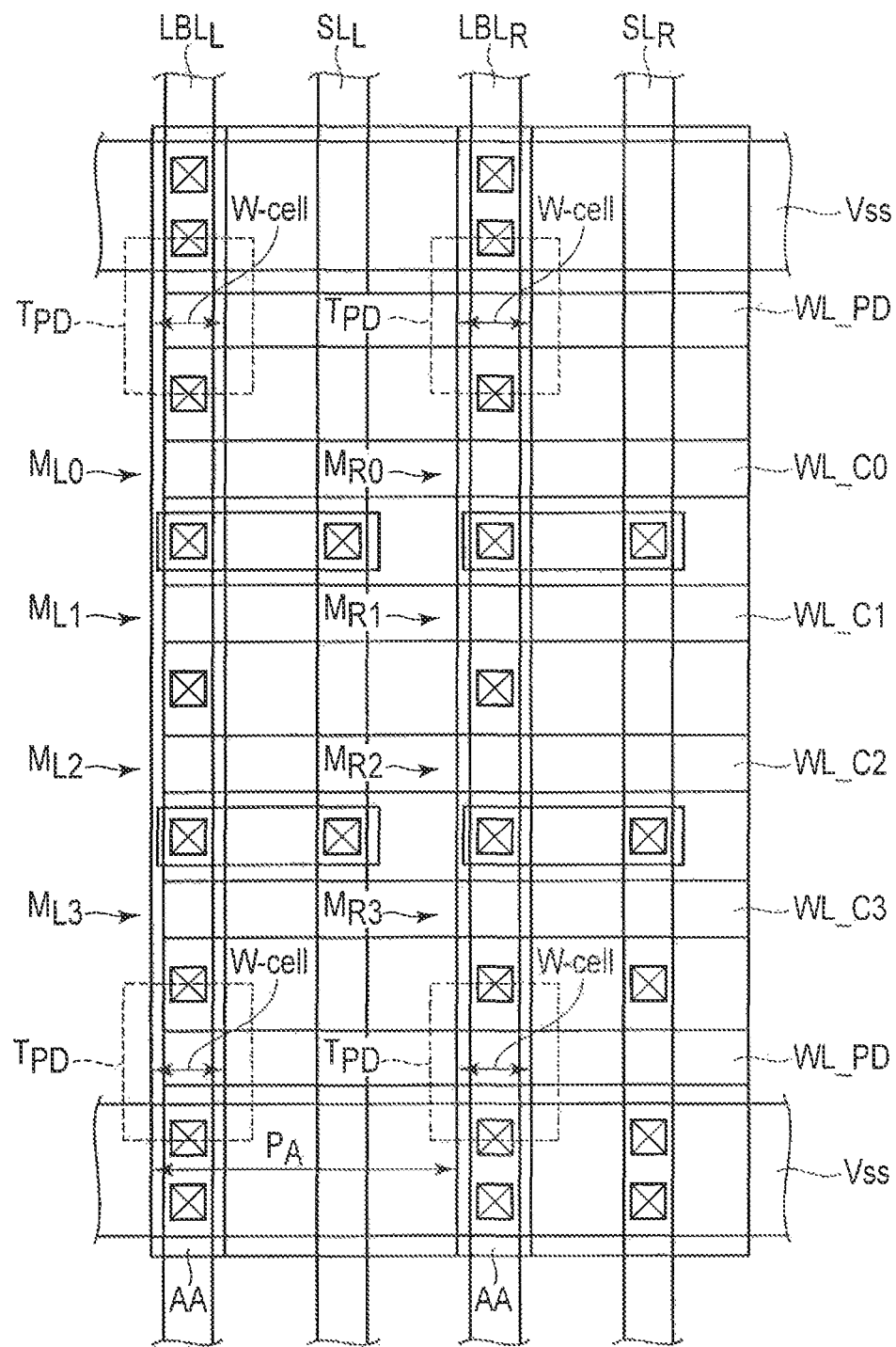
FIG. 2 is a plan view showing a layout of the configuration memory as shown in FIG. 1.

In general, according to one embodiment, a configuration memory comprises: first and second bit lines; a first memory cell including first and second MISFETs, each of the first and second MISFETs having a gate insulating layer, a source, a drain, and a gate, one of the source and the drain of the first MISFET being connected to the first bit line, the gate of the first MISFET being connected to a first word line, one of the source and the drain of the second MISFET being connected to the second bit line, the gate of the second MISFET being connected to the first word line; a first sense amplifier having a first output terminal and connected to the first and second bit lines; and a control circuit which is configured to write data in the first memory cell by injecting carriers in the gate insulating layer of the first MISFET to change a threshold voltage of the first MISFET from a first value to a second value and not to change threshold values of the second to fourth MISFETs from the first value to the second value.

(First Embodiment)

FIG. 1 shows a configuration memory according to a first embodiment.

The configuration memory comprises a configuration memory, a plurality of memory cells MC0, MC1, MC2 and MC3 connected to the local bit lines $LBL_R$ and $LBL_L$ and two sense amplifiers SA0 and SA1 connected to the local bit lines $LBL_R$ and $LBL_L$.

The memory cell MC0 comprises: a MISFET $M_{R0}$ having a drain connected to the local bit line $LBL_R$, a gate connected to a cell selection line WL_C0, and a source connected to a source line $SL_R$; and a MISFET $M_{L0}$ having a drain connected to the local bit line $LBL_L$, a gate connected to the cell selection line WL_C0, and a source connected to the source line $SL_L$.

The memory cell MC1 comprises: a MISFET $M_{R1}$ having a drain connected to the local bit line $LBL_R$, a gate connected to a cell selection line WL_C1, and a source connected to the source line $SL_R$; and a MISFET $M_{L1}$ having a drain connected to the local bit line $LBL_L$, a gate connected to the cell selection line WL_C1, and a source connected to the source line $SL_L$.

The memory cells MC2 and MC3 have the same structures as the memory cells MC0 and MC1. To be more specific, the memory cell MC2 comprises MISFETs $M_{R2}$ and $M_{L2}$, and the memory cell MC3 comprises MISFETs $M_{R3}$ and $M_{L3}$. The two MISFETs of the memory cells MC0, MC1, MC2 and MC3 are, e.g., of an N-channel type.

Contact of the MISFET $M_{L0}$ in the memory cell MC0 with the source line $SL_L$ and that of the MISFET $M_{L1}$ in the memory cell MC1 with the source line $SL_L$ are achieved by a single contact plug. Also, contact of the MISFET $M_{R0}$ in the memory cell MC0 with the source line $SL_R$ and a contact of the MISFET $M_{R1}$ in the memory cell MC1 with the source line $SL_R$ are achieved by a single contact plug.

Similarly, contact of the MISFET $M_{L1}$ in the memory cell MC1 with the local bit line $LBL_L$ and that of the MISFET $M_{L2}$ in the memory cell MC2 with the local bit line $LBL_L$ are achieved by a single contact plug. Also, contact of the MISFET $M_{R1}$ in the memory cell MC1 with the local bit line $LBL_R$ and that of the MISFET $M_{R2}$ in the memory cell MC2 with the local bit line $LBL_R$ are achieved by a single contact plug.

In such a manner, the above contact with each of the source lines $SL_L$ and $SL_R$ is achieved by a single contact plug, and that with each of the local bit lines $LBL_L$ and $LBL_R$ is also achieved by a single contact plug, as a result of which the areas (footprints) of the memory cells MC0, MC1, MC2 and MC3 are made smaller.

Each of the memory cells MC0, MC1, MC2 and MC3 stores 1-bit context data with associated two MISFETs. This embodiment relates to a multi-context configuration memory in which four context data is stored with four memory cells. However, the number of memory cells is not limited to four; that is, it suffices that the number of memory cells is two or more.

Each of the memory cells MC0, MC1, MC2 and MC3 stores 1-bit context data as the difference between threshold voltages of the associated two MISFETs. For example, when the two MISFETs have a first value as their initial threshold voltage, the threshold voltage of one of the two MISFETs is increased by a channel hot electron injection method, thereby causing 1-bit context data to be stored in a memory cell. By the channel hot electron injection method, the threshold voltage of the above one of the MISFETs is changed from Vti which is the first value (initial threshold voltage) to Vtw which is a second value (write threshold voltage). In this case, "Vtw>Vti" is satisfied.

In the first embodiment, a memory cell comprises two metal-insulator-semiconductor (MIS) FETs. This is because a MISFET can be formed in a standard CMOS process, and can also contribute to reduction of a manufacturing cost. However, the memory cell may use two transistors including charge accumulation layers, such as two metal-oxide-nitride-oxide-semiconductor (MONOS) transistors, in place of the two MISFETs.

A MISFET $T_{PD}$ includes a drain connected to the local bit line $LBL_R$ or $LBL_L$, a gate connected to a ground control line WL_PD, and a source connected to ground line Vss. For example, the MISFET $T_{PD}$ is of N-channel type.

The MISFET $T_{PD}$ functions as a pull-down transistor which lowers (pulls down) the potential of the local bit line $LBL_R$ or $LBL_L$ to a ground potential, when a write operation is performed by the channel hot electron injection. In order that at the time of writing, the potential of the local bit line $LBL_R$ or $LBL_L$ be set to the ground potential, it is preferable that a current driving force of the pull-down transistor be greater than that of a MISFET in a memory cell.

For the above reason, in the first embodiment, in order that the total channel width W-total of pull-down transistors be greater than a channel width W-cell of one of the MISFETs in the memory cell, two MISFETs $T_{PD}$ are connected to a single local bit line, i.e., either the local bit line $LBL_R$ or the local bit line $LBL_L$.

However, it is preferable that the channel width of one of the MISFETs in the memory cell be equal to that of one of the MISFETs $T_{PD}$. This is a design to decrease a layout area.

In the above case, as shown in FIG. 2, one of the two MISFETs $T_{PD}$ connected to the local bit line $LBL_R$ or $LBL_L$ is connected to one of outermost ones of memory cells ML0, ML1, ML2 and ML3 connected in series, and the other MISFET $T_{PD}$ is connected to the other one of the outermost memory cells.

By virtue of the above feature, the channel width of each of a single MISFET in a memory cell and a single MISFET $T_{PD}$ serving as a pull-down transistor is the channel width W-cell, whereas the total channel width of two MISFETs $T_{PD}$ connected to the local bit line $LBL_R$ or $LBL_L$ is double the channel width W-cell; i.e., W-cell×2.

Furthermore, although the total channel width of the pull-down transistors is set large, the layout area can be reduced as described above, since a pitch $P_A$ of an active area AA in an memory cell array can be maintained.

The MISFETs in the memory cells MC0, MC1, MC2 and MC3 are formed in an independent well which can be independently controlled in potential. If the MISFETs in the memory cell are N-channel FETs, the independent well is a P-type independent well Wp. A lower portion of the P-type independent well Wp is covered by a deep N-type well (deep N well), and a peripheral portion of the P-type independent well Wp is surrounded by an N-type well (Wn). Thus, the potential of the P-type independent well Wp can be controlled independently.

In such a manner, the memory cells MC0, MC1, MC2 and MC3 are formed in the P-type independent well Wp for the reason that at the time of writing data to the memory cells MC0, MC1, MC2 and MC3, a writing speed can be improved by controlling the potential (body potential) of the P-type independent well Wp.

In the first embodiment, the MISFETs $T_{PD}$ are also provided in the P-type independent well (Wp). This is a design to reduce the layout area. Unlike this case, the MISFETs $T_{PD}$ may be formed in a P-type common well, not the P-type independent well Wp.

An operation for writing data to a memory cell will be explained in detail in a description concerning a third embodiment.

The sense amplifiers SA0 and SA1 each includes a single output terminal, read data held in a memory cell selected by a selected cell selection line WL_Cx (x is any of 0-3), and then continuously output the data at the same time as holding the data.

A pre-charge circuit PC is connected to the local bit lines $LBL_R$ and $LBL_L$, and sets the local bit lines $LBL_R$ and $LBL_L$ at a pre-charge potential Vpre. The pre-charge circuit PC comprises two P-channel MISFETs whose gates are connected to a pre-charge control line WL_PC.

It is possible to read context data, for example, by setting the selected cell selection line WL_Cx (x is any of 0-3) at a sense voltage (Vsense) after setting the local bit lines $LBL_R$ and $LBL_L$ at the precharge potential Vpre.

In the above case, for example, the sense amplifier SA0 detects context data stored in a memory cell as the difference between the potentials of the local bit lines $LBL_R$ and $LBL_L$, which depends on the difference between the threshold voltages of two MISFETs in the memory cell.

The sense voltage (Vsense) is set to, e.g., a third value between the first value (initial threshold voltage) Vti and the second value (write threshold voltage) Vtw. In this case, since the ratio between channel resistances of the two MISFETs in the memory cell becomes large, it is possible to read a slight difference between the threshold voltages.

Furthermore, the sense voltage (Vsense) may be set to a value larger than Vtw. In this case, a local bit line can be discharged at a higher speed, thus enabling a read operation to be performed at a high speed.

An operation for reading data from a memory cell will be explained in detail in a description concerning a fourth embodiment.

In the first embodiment, the two sense amplifiers SA0 and SA1 are connected to the local bit lines $LBL_R$ and $LBL_L$. This is intended to switch context data at every cycle by complementarily operating the sense amplifiers SA0 and SA1.

Selections of the sense amplifiers SA0 and SA1 are made by sense-amplifier selection lines WL_SA0 and WL_SA1, respectively.

In the first embodiment, there is further provided a multiplexer (MUX) having two input terminals and one output terminal. The output terminals of the sense amplifiers SA0 and SA1 are connected to the input terminal of the multiplexer (MUX), and the output terminal of the multiplexer (MUX) serves as a configuration data output terminal (OUT).

For example, the multiplexer (MUX) selects one of output signals of the sense amplifiers SA0 and SA1 based on the potential of a multiplexer control line WL_MUX, and outputs the selected output signal from the configuration data output terminal (OUT).

MISFETs $T_{TG}$ include drains connected to bit lines $BL_R$ and $BL_L$, sources connected to the local bit lines $LBL_R$ and $LBL_L$, and gates connected to a memory selection line WL_TG. The MISFETs $T_{TG}$ are of, e.g., a P-channel type.

Also, the MISFETs $T_{TG}$ are transfer transistors for use in directly writing data to the sense amplifiers SA0 and SA1 through the bit lines $BL_R$ and $BL_L$, for example, at the time of conducting a test.

An operation for writing data to the sense amplifiers will be explained in a description concerning a fifth embodiment.

In such a manner, in the configuration memory according to the first embodiment, each of the memory cells MC0, MC1, MC2 and MC3 comprises two MISFETs, and data is written by raising one of the threshold voltages of the two MISFETs due to injection of channel hot electrons. Also, any adjacent two of the memory cells MC0, MC1, MC2 and MC3 share a contact with the source line $SL_L$ or $SL_R$ or a contact with the local bit line $LBL_L$ or $LBL_R$. As a result, a nonvolatile configuration memory having a small cell area can be achieved at a low cost.

(Second Embodiment)

Figure 3:
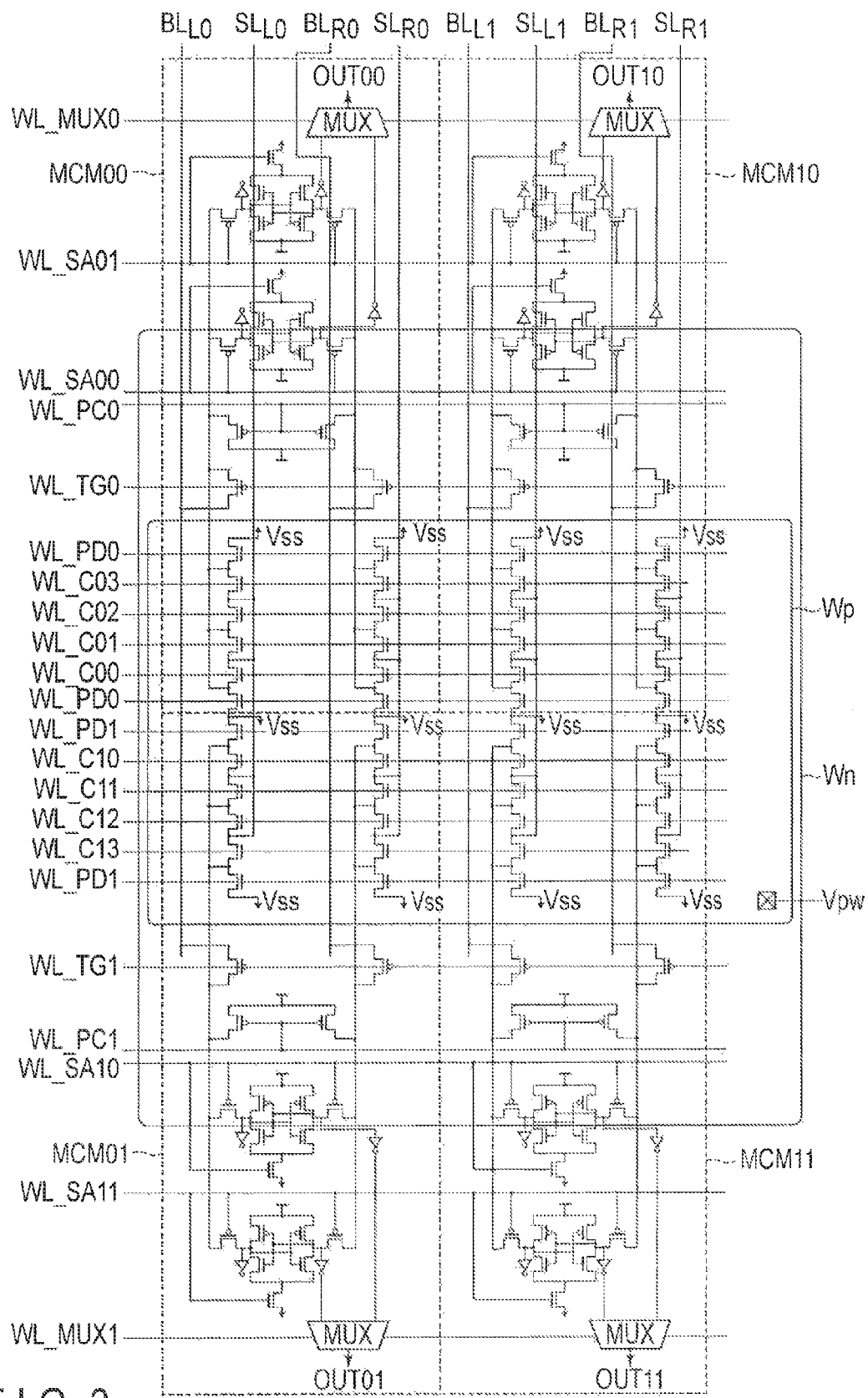
FIG. 3 is a circuit diagram of an array in a configuration memory according to a second embodiment.

FIG. 3 shows an array of configuration memories according to a second embodiment.

In the second embodiment, four configuration memories MCM00, MCM01, MCM10 and MCM11 are arranged in an array. However, this is an example, and it suffices that each of the number of memories arranged in a row direction in which cell selection lines WL_C00-WL_C03 and WL_C10-WL_C13 extend and that of configuration memories arranged in a column direction in which bit lines $BL_{L0}$, $BL_{R0}$, $BL_{L1}$ and $BL_{R1}$ and source lines $SL_{L0}$, $SL_{R0}$, $SL_{L1}$ and $SL_{R1}$ extend is two or more.

The configuration memories MCM00 and MCM10, which are arranged in the row direction, share the cell selection lines WL_C00-WL_C03, a ground control line WL_PD0, a memory selection line WL_TG0, a pre-charge control line WL_PC0, sense-amplifier selection lines WL_SA00 and WL_SA01, and a multiplexer control line WL_MUX0. Those lines extend in the row direction.

Similarly, the configuration memories MCM01 and MCM11, which are arranged in the row direction, share the cell selection lines WL_C10-WL_C13, a ground control line WL_PD1, a memory selection line WL_TG1, a pre-charge control line WL_PC1, a sense-amplifier selection lines WL_SA10 and WL_SA11 and a multiplexer control line WL_MUX1. Those lines also extend in the row direction.

The configuration memories MCM00 and MCM01, which are arranged in the column direction, share bit lines $BL_{L0}$ and $BL_{R0}$ and source lines $SL_{L0}$ and $SL_{R0}$. Those lines extend in the column direction. Similarly, the configuration memories MCM10 and MCM11, which are arranged in the column direction, share bit lines $BL_{L1}$ and $BL_{R1}$ and source lines $SL_{L1}$ and $SL_{R1}$. Those lines extend in the column directions.

A plurality of memory cells in the four configuration memories MCM00, MCM01, MCM10 and MCM11 are placed in the single P-type independent well Wp.

It should be noted that a circuit diagram of the second embodiment corresponds to a layout as shown in FIG. 2. For example, one of the two pull-down transistors (MISFETs) connected to the ground control line WL_PD0 is placed at one of outermost ones of a plurality of memory cells connected in series, and the other pull-down transistor is placed at the other of the outermost memory cells.

In this case, with respect to any two configuration memories arranged adjacent to each other in the column direction, e.g., a pull-down transistor in the configuration memory MCM00 and a pull-down transistor in the configuration memory MCM01 can be made to share a contact with a ground line Vss Since the array configuration is placed in the above manner, it is possible to provide a nonvolatile configuration memory having a small area.

(Third Embodiment)

FIG. 4 is a view for use in explaining a write operation to memory cells according to a third embodiment.

Suppose in an initial state, threshold voltages of MISFETs $M_{L0}$, $M_{R0}$, $M_{L1}$, $M_{R1}$, $M_{L2}$, $M_{R2}$, $M_{L3}$ and $M_{R3}$ in the memory cells MC0, MC1, MC2 and MC3 have a first value (initial threshold voltage). It will be explained by way of example that from the above state, data is written to the memory cell MC0.

In the third embodiment, the threshold voltage of the MISFET $M_{R0}$ in the memory cell MC0 is changed from the first value to a second value (write threshold voltage), and the threshold voltage of the MISFET $M_{L0}$ in the memory cell MC0 is kept at the first value, to thereby write data ("1") to the memory cell MC0.

Unlike the above case, in the case where data ("0") is written to the memory cell MC0, the threshold voltage of the MISFET $M_{R0}$ in the memory cell MC0 is kept at the first value, and the threshold voltage of the MISFET $M_{L0}$ in the memory cell MC0 is changed from the first value to the second value (write threshold voltage).

In the third embodiment, the cell selection line WL_C0, to which a selected MISFET $M_{R0}$ is connected, is set at a write gate voltage (Vg_prg). With the write gate voltage Vg_prg applied, the MISFETs $M_{L0}$ and $M_{R0}$ are made to be in the on-state. The other cell selection lines (non-selected cell selection lines) are set at an off-potential Voff at which MISFETs $M_{L1}$, $M_{R1}$, $M_{L2}$, $M_{R2}$, $M_{L3}$ and $M_{R3}$ are turned off. Also, the ground control line WL_PD is set at an on-potential Von at which a MISFETs $T_{PD}$ turns on.

When the ground control line WL_PD turns on, the potentials of the local bit lines $LBL_L$ and $LBL_R$ are set to the ground potential Vss or a value close thereto. This potential corresponds to a write source potential (Vs_prg) which is applied to the source of the selected MISFET $M_{R0}$.

Furthermore, the memory selection line WL_TG is set to the off-potential Voff (e.g., Vdd) at which the MISFET $T_{TG}$ turns off, and the pre-charge control line WL_PC is set to the off-potential Voff (e.g., Vdd), at which the pre-charge circuit PC is made in a nonoperating state.

The sense-amplifier selection lines WL_SA0 and WL_SA1 are set to a hold potential Vhold (e.g., Vdd) at which the sense amplifiers SA0 and SA1 are electrically disconnected from the local bit lines $LBL_L$ and $LBL_R$.

Figure 5A:
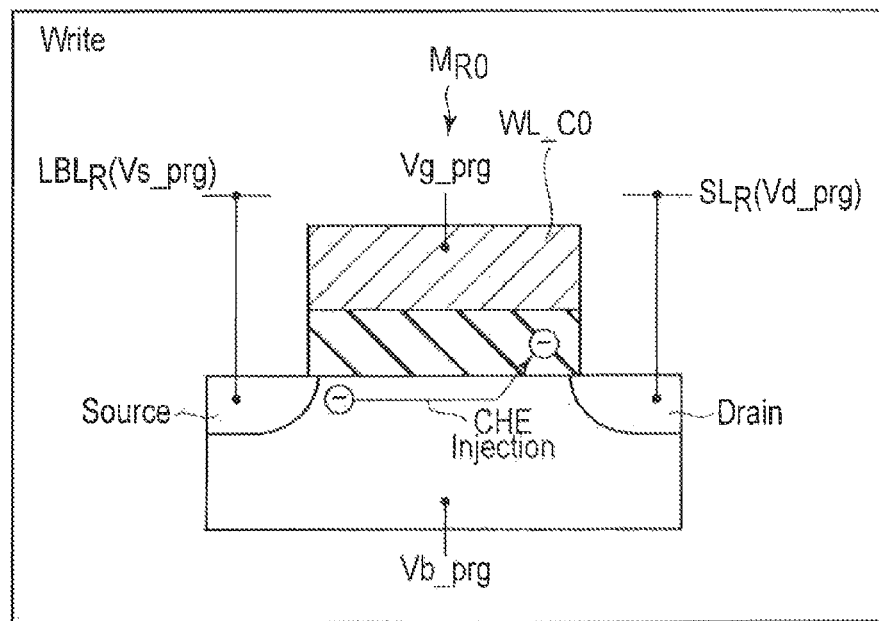
FIG. 5A is a view for explaining a channel hot electron write operation.

In the above state, a write potential (write pulse) is applied to the source line $SL_R$. At this time, for example, as shown in FIG. 5A, in the MISFET $M_{R0}$, a flow of electrons from a local bit line $LBL_R$ side toward a source line $SL_R$ side generates, and channel hot electrons generate in the vicinity of the drain of the MISFET $M_{R0}$. Some of the generated channel hot electrons are caught in a gate insulating film, as a result of which the threshold voltage of the MISFET $M_{R0}$ is raised from the first value to the second value (write threshold voltage).

Figure 5B:
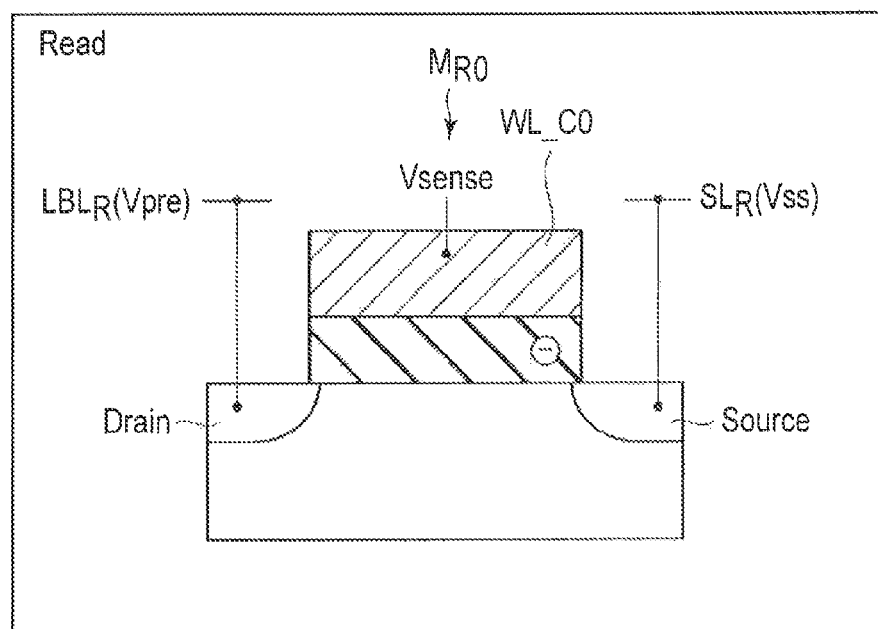
FIG. 5B is a view showing a positional relationship between a source and a drain in a read operation.

The important point is that in the write operation, the source line $SL_R$ side functions as a drain, and the local bit line $LBL_R$ side functions as a source. This positional relationship between the source and the drain is opposite to that in a read operation as shown in FIG. 5B. That is, as described later, in the read operation, the source line $SL_R$ side functions as a source, and the local bit line $LBL_R$ side functions as a drain.

In such a manner, in the case where the positional relationship between the source and the drain in the write operation is made opposite to that in the read operation, the threshold of a memory cell is more greatly varied by a channel hot electron injection. Thus, writing time can be shortened. In the case where the positional relationship between the source and the drain in the write operation is made opposite to that in the read operation, the variation of the threshold of the memory cell due to the channel hot electron injection is increased for the following reason:

In the write operation with the channel hot electron injection, as shown in FIG. 5A, electrons are trapped mainly in a gate insulating layer close to the drain of a MISFET, and thus become fixed charge. On the other hand, in the read operation, fixed charge close to the source of a MISFET has a greater influence upon the threshold of the memory cell than the fixed charge close to the drain of the MISFET. That is, if the amount of charge trapped in the gate insulating layer is fixed, in the read operation, in the case where electrons are trapped in the vicinity of the source of the MISFET, the write threshold voltage Vtw is greater than that in the case where electrons are trapped in the vicinity of the drain of the MISFET.

It should be noted that in the write operation, the potential of the P-type the independent well Wp may be set to a write body voltage Vb_prg. For example, where Vg_prg is a positive potential, e.g., approximately 1.2 V, Vd_prg is a positive potential, e.g., approximately 3.3 V, and Vs_prg is approximately 0 V, it is preferable that Vb_prg be a negative potential, e.g., approximately −3.3 V.

Vd_prg depends on material of the gate insulating layer of the MISFET. To be more specific, if the gate insulating layer is formed of $SiO_2$, generally, Vd_prg is 2 V or more. It is preferable that Vg_prg be equal to or less than Vd_prg in order that the channel hot electron injection be efficiently performed.

The writing speed can be improved by establishing such a relationship as described above.

(Fourth Embodiment)

Figure 6:
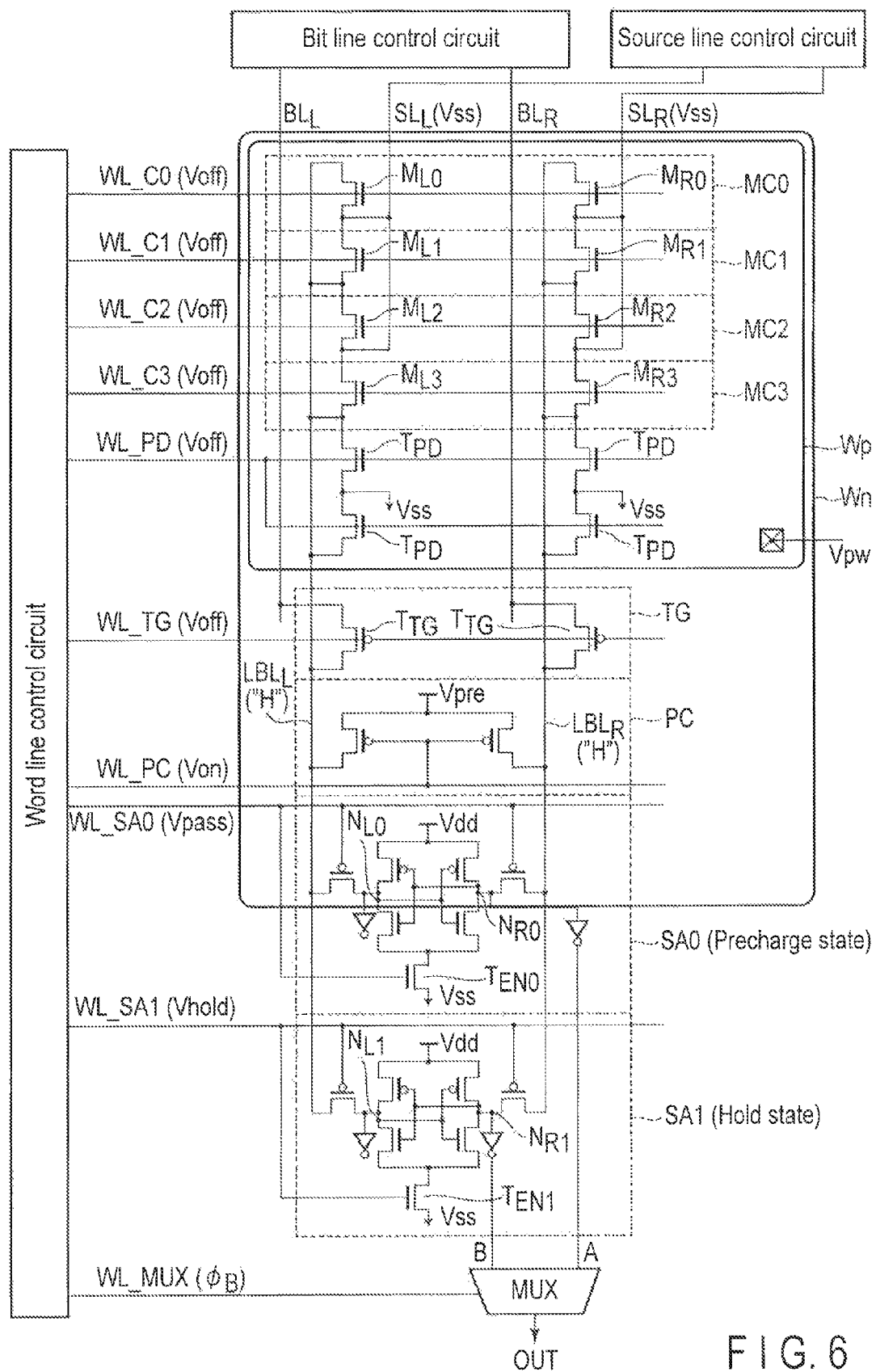
Figure 9:
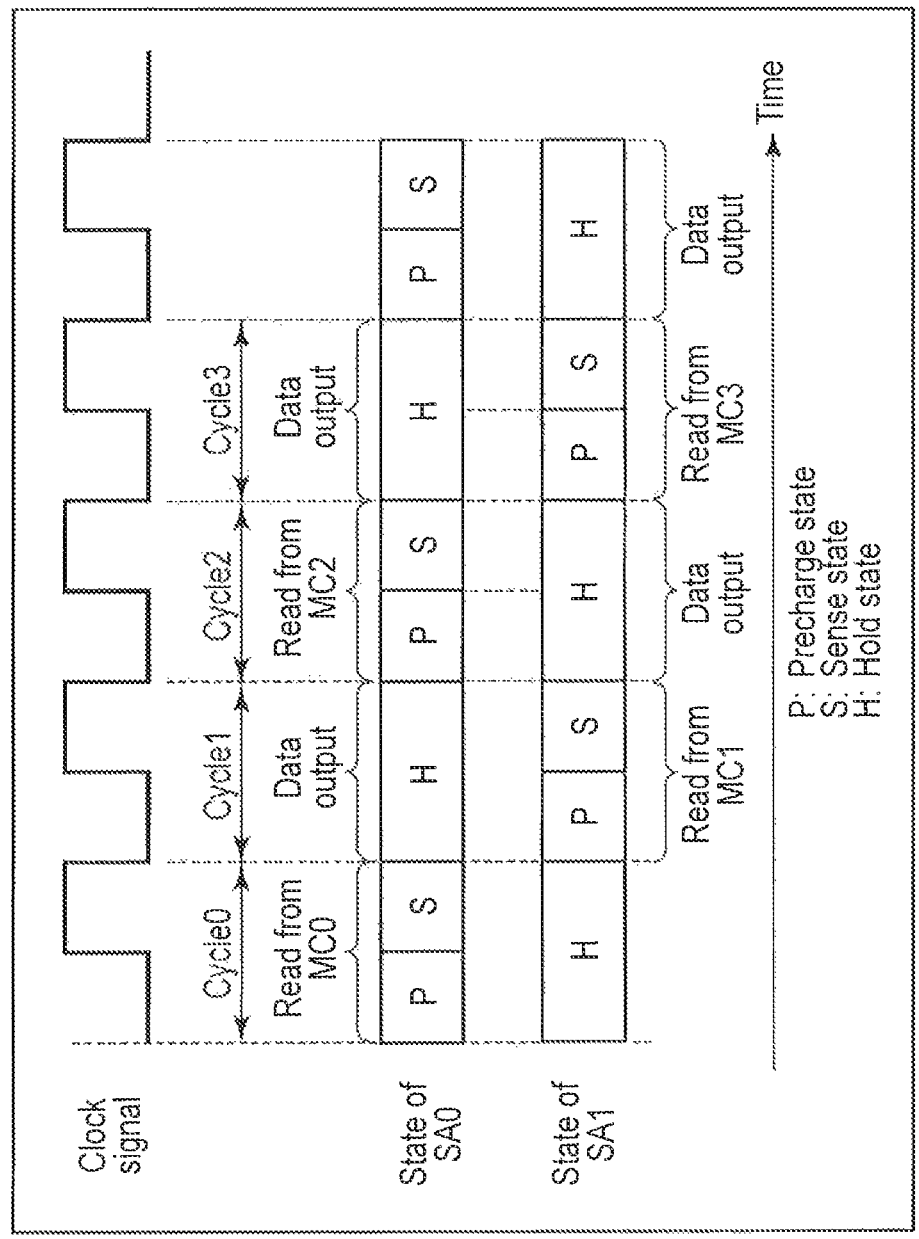
FIG. 9 is a view showing a procedure of a read operation at every cycle.

FIGS. 6-8 are views for explaining a read operation according to a fourth embodiment. FIG. 9 shows a procedure of the read operation according to the fourth embodiment.

Reading of data from a memory cell MCx with a sense amplifier SAx has a pre-charge phase and a sense phase, and is carried out in one cycle time. After reading of the data, during one cycle time, the sense amplifier SAx enters a hold mode in which it outputs hold data.

It should be noted that in a zeroth cycle, data stored in the memory cell MC0 is read with a sense amplifier SA0 (FIG. 9). At the same time, hold data of a sense amplifier SA1 is output. Then, in a first cycle, hold data of the sense amplifier SA0 is output. At the same time, data stored in the memory cell MC1 is read with the sense amplifier SA1. In such a manner, the two sense amplifiers, i.e., the sense amplifiers SA0 and SA1, alternately reading and outputting operations at every cycle, as a result of which a context to be read can be switched at every cycle.

Operations in the pre-charge phase, sense phase and hold phase of the sense amplifier SA0 will be explained in due order.

FIG. 6 shows the operation in the pre-charge phase of the sense amplifier SA0.

As shown in FIG. 6, in the pre-charge phase, the pre-charge control line WL_PC is set at the on-potential Von (e.g., Vss), at which the pre-charge circuit PC is made in an operating state. At this time, the pre-charge circuit PC sets the potentials of the local bit lines $LBL_L$ and $LBL_R$ at a pre-charge potential Vpre ("H"-level).

Furthermore, the sense-amplifier selection line WL_SA0 is set to a pass potential Vpass (e.g., Vss) at which the sense amplifier SA0 is electrically connected to the local bit lines $LBL_L$ and $LBL_R$. At this time, a MISFET TEN0 which serves as an enable switch of the sense amplifier SA0 is in the off-state, and thus the sense amplifier SA0 is in a nonoperating state (inactive state).

As a result, in the pre-charge phase, data nodes NL0 and NR0 of the sense amplifier SA0 have the pre-charge potential Vpre ("H"-level).

It should be noted that in the pre-charge phase, word lines WL_C0, WL_C1, WL_C2 and WL_C3 and the ground control line WL_PD are set at the off-potential Voff (e.g., Vss), and the memory selection line WL_TG is also set at the off-potential Voff (e.g., Vdd).

FIG. 7 shows the operation in the sense phase of the sense amplifier SA0.

In the sense phase, the pre-charge control line WL_PC is set at the off-potential Voff (e.g., Vdd) at which the pre-charge circuit PC is made in the nonoperating state. Furthermore, the selected cell selection line WL_C0 is set to a read potential Vsense. The potentials of the other word lines (nonselected word lines) are kept at the off-potential Voff at which the MISFETs $M_{L1}$, $M_{R1}$, $M_{L2}$, $M_{R2}$, $M_{L3}$ and $M_{R3}$ are turned off.

Furthermore, the source lines $SL_L$ and $SL_R$ are set at the ground potential Vss.

At this time, a potential difference between the local bit lines $LBL_L$ and $LBL_R$ is made in accordance with the difference between channel resistances of the MISFETs $M_{L0}$ and $M_{R0}$ in the memory cell MC0.

In the fourth embodiment, suppose the threshold voltage of the MISFET $M_{L0}$ is the second value (write threshold voltage Vtw), and that of the MISFET $M_{R0}$ is the first value (initial threshold voltage Vti). In this case, as shown in FIG. 7, when the MISFETs $M_{R0}$ and the MISFET $M_{L0}$ are given the same gate voltage Vsense, the local bit line $LBL_R$ is discharged earlier than the local bit line $LBL_L$ since the channel resistance of the MISFET $M_{R0}$ is lower than that of the MISFET $M_{L0}$. As a result, the potential of the local bit line $LBL_R$ becomes lower than that of the local bit line $LBL_L$.

It should be noted that in FIG. 7, "H*" means a potential lower than an H-level, e.g., Vdd, and "L*" means a potential higher than an L-level, e.g., Vss.

In the sense phase, the sense-amplifier selection line WL_SA0 is set at the pass potential Vpass (e.g., Vss) as in the pre-charge phase. Thus, the potentials of the local bit lines $LBL_L$ and $LBL_R$ are reflected in the potentials of the data nodes ($N_{L0}$ and $N_{R0}$) of the sense amplifier SA0 through a transfer gate of the sense amplifier SA0. As a result, the potential ("L*") of the data node $N_{R0}$ becomes lower than that ("H*") of the data node $N_{L0}$.

During the read operation, the ground potential (Vss) is applied to a source line. Thus, during the read operation, of the terminals of a transistor of a memory cell, a terminal connected to a local bit line is a drain terminal, and a terminal connected to the source line is a source terminal.

FIG. 8 shows the operation in the hold phase of the sense amplifier SA0.

As shown in FIG. 8, in the hold phase, the sense-amplifier selection line WL_SA0 is set at the hold potential Vhold (e.g., Vdd). At this time, the transfer gate of the sense amplifier SA0 is made in the off-state, and the data nodes ($N_{L0}$ and $N_{R0}$) are electrically disconnected from the local bit lines $LBL_L$ and $LBL_R$. At the same time, the MISFET TEN0, which serves as the enable switch of the sense amplifier SA0, is made in the on-state, as a result of which the sense amplifier SA0 is made in the active state. Accordingly, the potential difference between the data nodes ($N_{L0}$ and $N_{R0}$) is increased; and the potential of the data node $N_{R0}$ is made at the "L"-level, and that of the data node $N_{L0}$ is made at the "H"-level. Thereafter, the potentials of the data nodes are maintained throughout the hold phase.

Furthermore, in the hold phase, the multiplexer control line WL_MUX is set at φA. That is, the multiplexer MUX selects data held in the sense amplifier SA0, and outputs it as an output data OUT.

In such a manner, as shown in FIGS. 6 and 7, when the sense amplifier SA0 performs the read operation (the pre-charge phase and the sense phase), the sense amplifier SA1 is in the hold phase. When the sense amplifier SA1 is in the hold phase, the sense-amplifier selection line WL_SA1 is set at the hold potential Vhold (e.g., Vdd) at which the sense amplifier SA1 is electrically disconnected from the local bit lines $LBL_L$ and $LBL_R$. Thus, the variation of the potentials of the local bit lines $LBL_L$ and $LBL_R$ due to the read operation of the sense amplifier SA0 has no influence upon the data nodes of the sense amplifier SA1. That is, at this time, the multiplexer control line WL_MUX is set at φB. The multiplexer MUX selects data held in the sense amplifier SA1, and outputs it as an output data OUT.

On the other hand, as shown in FIG. 8, when the sense amplifier SA1 performs the read operation (the pre-charge phase and the sense phase), the sense amplifier SA0 is in the hold phase. When the sense amplifier SA0 is in the hold phase, the sense-amplifier selection line WL_SA0 is set at the hold potential Vhold (e.g., Vdd) at which the sense amplifier SA0 is electrically disconnected from the local bit lines $LBL_L$ and $LBL_R$. Thus, the variation of the potentials of the local bit lines $LBL_L$ and $LBL_R$ due to the read operation of the sense amplifier SA1 has no influence upon the data nodes of the sense amplifier SAG. That is, at this time, the multiplexer control line WL_MUX is set to φA. The multiplexer MUX selects data held in the sense amplifier SA1, and outputs it as an output data OUT.

It should be noted that with respect to the fourth embodiment, a method in which pre-charge to the H-level is performed is explained; however, the read operation can also be performed in a method in which pre-charge to the L-level is performed.

In the latter method, as shown in FIG. 19, transfer transistors $T_{TG}$ connected to bit lines, transfer gates in the sense amplifiers SA0 and SA1 and transistors in the pre-charge circuit PC are formed of N-channel type MOS transistors.

Furthermore, sense enable transistors (EN) in the sense amplifiers SA0 and SA1 are formed of P-channel type MOS transistors.

In the sense phase, Vdd is applied to a source line to charge a local bit line through a memory cell. Also, a potential difference between local bit lines, which is made due to the difference between the resistances of two MISFETs in the memory cell, is detected by a sense amplifier.

(Fifth Embodiment)

Figure 11:
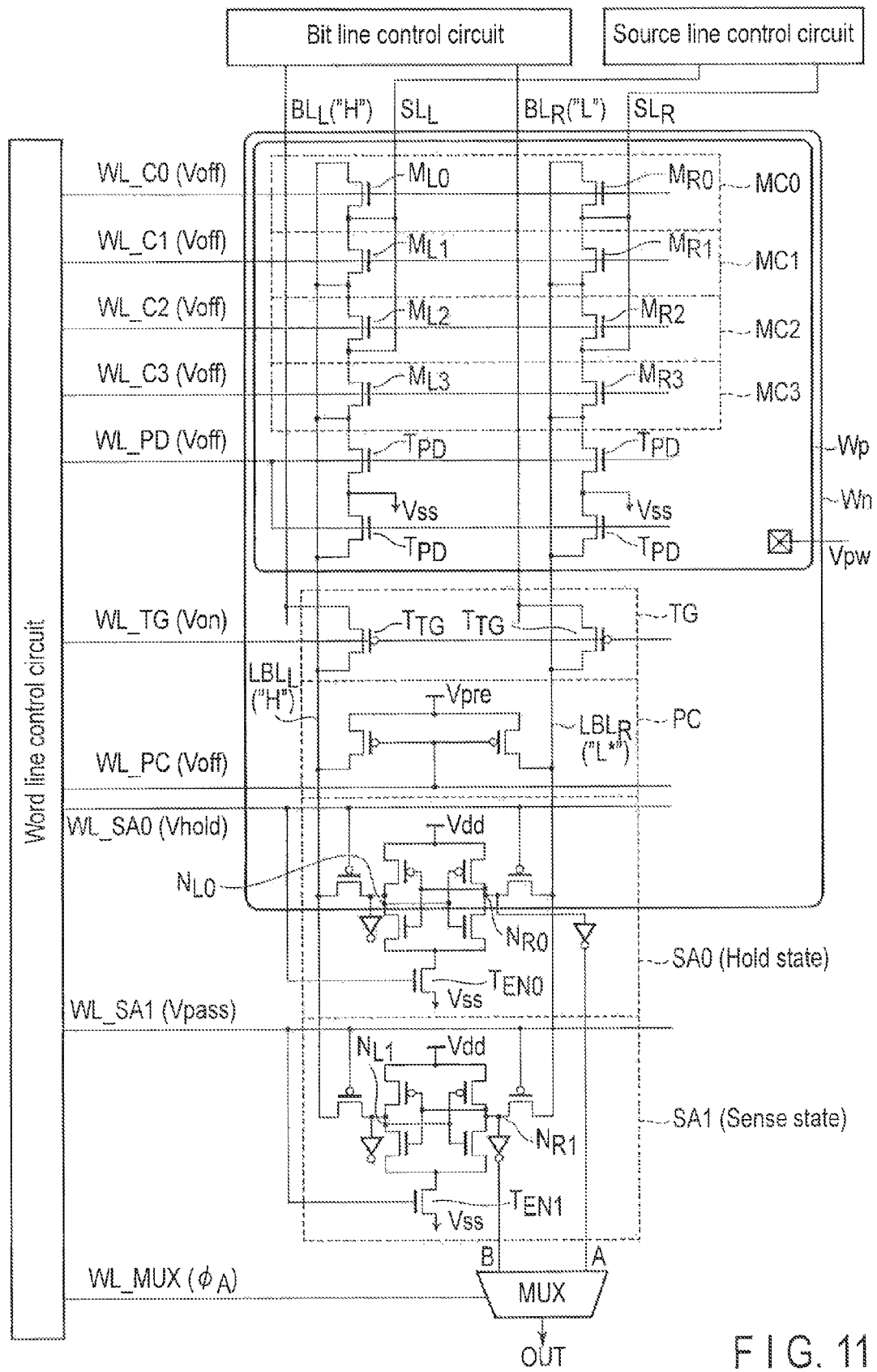

FIGS. 10 and 11 are views for explaining a write operation on a sense amplifier according to the fifth embodiment.

In the configuration memories explained with respect to the first to fourth embodiments, in an operation test process, etc., it is preferable that data could be directly written from the bit lines $BL_L$ and $BL_R$ to a sense amplifier, without writing data to a memory cell.

As shown in FIG. 10, for example, when data is written to the sense amplifier SA0, the memory selection line WL_TG is set at the on-potential Von (e.g., Vss).

As a result, the MISFET $T_{TG}$ turns on, and data is transferred from the bit lines $BL_L$ and $BL_R$ to the local bit lines $LBL_L$ and $LBL_R$. In the fifth embodiment, the bit line $BL_L$ is at "L"-level, e.g., Vss, and the bit line $BL_R$ is at "H"-level, e.g., Vdd; and thus the potential of the local bit line $LBL_L$ is lower than that of the local bit line $LBL_R$.

It should be noted that since the MISFET $T_{TG}$, which serves as a transfer gate, is of P-channel type, "L"-level of the bit line, e.g., Vss, cannot be accurately transferred to a local bit line. That is, the potential of the local bit line cannot be lowered less than the threshold voltage of the MISFET $T_{TG}$, which is of P-channel type.

However, the potentials of the local bit lines $LBL_L$ and $LBL_R$ do not need to be changed from Vdd to Vss. This is because as long as a potential difference is made between the local bit lines $LBL_L$ and $LBL_R$, the sense amplifier SA0 can effect sensing for detecting the potential difference.

Furthermore, as shown in FIG. 10, in the sense phase, the sense-amplifier selection line WL_SA0 is set at the pass potential Vpass. As a result, the potential of the data node $N_{L0}$ in the sense amplifier SA0 becomes lower than that of the data node $N_{R0}$.

As shown in FIG. 11, in the hold phase, the sense-amplifier selection line WL_SA0 is set at the hold potential Vhold (e.g., Vdd). At this time, the transfer gate of the sense amplifier SA0 is made in the off-state, and the data nodes ($N_{L0}$ and $N_{R0}$) are electrically disconnected from the local bit lines $LBL_L$ and $LBL_R$. At the same time, the MISFET TEN0, which serves as the enable switch of the sense amplifier SA0, is made in the on-state, and the sense amplifier SA0 is thus made in the active state.

As a result, the potential difference between the data nodes ($N_{L0}$ and $N_{R0}$) is increased; and the potential of the data node $N_{L0}$ is made at the "L" level, and that of the data node $N_{R0}$ is made at the "H" level. Thereafter, the potential of the data nodes is maintained throughout the hold phase.

It should be noted that as shown in FIG. 11, in the hold phase of the sense amplifier SA0, data can also be directly written from the bit lines $BL_L$ and $BL_R$ to the sense amplifier SA1.

In such a manner, data to be written may be input from the bit lines $BL_L$ and $BL_R$.

(Sixth Embodiment)

Figure 12:
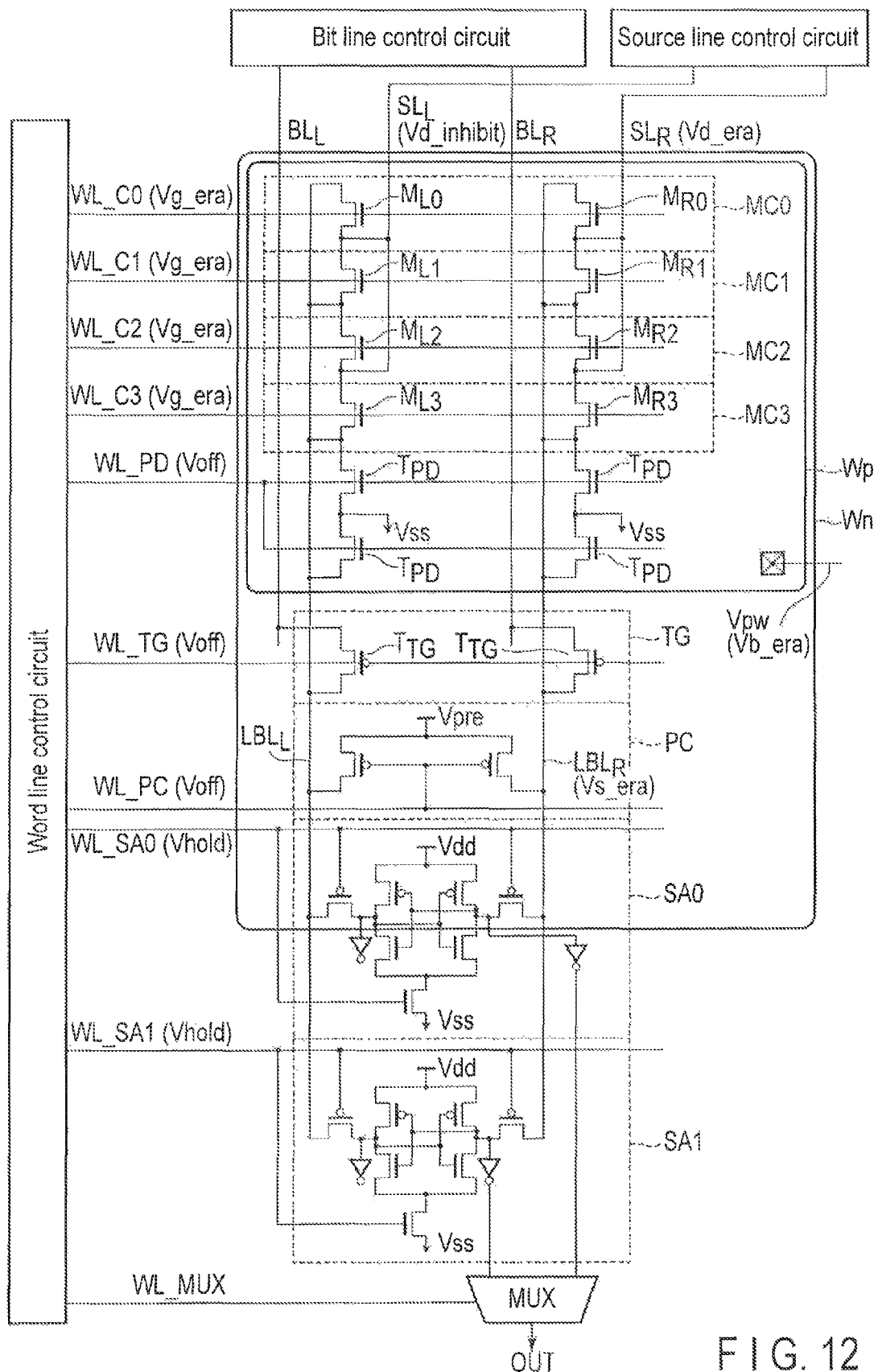
FIG. 12 is a circuit diagram for explaining an erasure operation for cell data in a sixth embodiment.

FIG. 12 is a view for explaining an erasure operation for cell data in the sixth embodiment.

The erasure operation for cell data means erasure of data stored in the memory cells MC0, MC1, MC2 and MC3. For example, the erasure operation for cell data is an operation to return the threshold voltages of the MISFETs $M_{L0}$, $M_{L1}$, $M_{L2}$, $M_{L3}$, $M_{R0}$, $M_{R1}$, $M_{R2}$ and $M_{R3}$ to the first value (initial threshold voltage).

The following explanation is given of an operation to return the threshold voltages of the MISFETs $M_{R0}$, $M_{R1}$, $M_{R2}$ and $M_{R3}$ connected to the source line $SL_R$ to the first value. In this case, the threshold voltages of the MISFETs $M_{L0}$, $M_{L1}$, $M_{L2}$ and $M_{L3}$ connected to the source line $SL_L$ are not changed. However, this erasure is an example of the erasure operation. Instead of this example, the erasure operation can also be performed by returning the threshold voltages of the MISFETs $M_{L0}$, $M_{L1}$, $M_{L2}$, $M_{L3}$, $M_{R0}$, $M_{R1}$, $M_{R2}$ and $M_{R3}$ connected to the source lines $SL_L$ and $SL_R$ to the first value at the same time.

It should be noted that in the fifth embodiment, the objects to be subjected to the erasure operation are the MISFETs $M_{R0}$, $M_{R1}$, $M_{R2}$ and $M_{R3}$; however, there is a case where the threshold voltage in one of those MISFETs is the first value and also a case where the threshold voltage in one of the MISFETs is the second value (write threshold voltage). Therefore, when the threshold voltage in one of the MISFETs $M_{R0}$, $M_{R1}$, $M_{R2}$ and $M_{R3}$ is the first value, the threshold voltage is unchanged before and after the erasure operation. On the other hand, when the threshold voltage in one of the MISFETs $M_{R0}$, $M_{R1}$, $M_{R2}$ and $M_{R3}$ is the second value, the threshold voltage is changed to the first value by the erasure operation.

A voltage to be applied at the time of performing the erasure operation will be explained.

In the erasure operation for cell data, of two terminals (N-type diffusion layers) connected to the channel of each of the MISFETs $M_{L0}$, $M_{L1}$, $M_{L2}$ and $M_{L3}$ or MISFETs $M_{R0}$, $M_{R1}$, $M_{R2}$ and $M_{R3}$, a terminal located on the source line $SL_L$ side or the source line $SL_R$ side will be referred to as a drain. A selected source line $SL_R$ is set to an erasure drain voltage Vd_era, which is, e.g., 0 V.

The potential (Vpw) of the P-type independent well Wp is set to an erasure body voltage Vb_era, which is set to a value at which forward current flows in a PN junction between the P-type independent well Wp and the N-type diffusion layers (drains) of the MISFETs $M_{R0}$, $M_{R1}$, $M_{R2}$ and $M_{R3}$ on the source line $SL_R$ side. For example, the erasure body voltage Vb_era is 3.3 V.

As a result, in the MISFETs $M_{R0}$, $M_{R1}$, $M_{R2}$ and $M_{R3}$ to be subjected to the erasure operation, large forward current flows from the P-type independent well Wp toward the drains of the MISFETs $M_{R0}$, $M_{R1}$, $M_{R2}$ and $M_{R3}$. Thereby, trapped electrons in gate insulating films located close to the drains of the MISFETs $M_{R0}$, $M_{R1}$, $M_{R2}$ and $M_{R3}$ are released into the P-type independent well Wp or holes are injected from the P-type independent well Wp into the gate insulating films close to the drains of the MISFETs $M_{R0}$, $M_{R1}$, $M_{R2}$ and $M_{R3}$. The threshold voltages of the MISFETs $M_{R0}$, $M_{R1}$, $M_{R2}$ and $M_{R3}$ are changed back to the first value (initial threshold voltage).

On the other hand, non-selected source lines $SL_L$ are set at an erasure inhibiting drain voltage Vd_inhibit, which is the same value as Vb_era, e.g., 3.3 V. Alternatively, the non-selected source lines $SL_L$ may be set in a floating state. In any case, in the MISFETs $M_{L0}$, $M_{L1}$, $M_{L2}$ and $M_{L3}$, i.e., the MISFETs not to be subjected to the erasure operation, forward current necessary for erasure, which is directed from the P-type independent well Wp toward the N-type diffusion layers (drains), does not flow. Therefore, the threshold voltages of the MISFETs $M_{L0}$, $M_{L1}$, $M_{L2}$ and $M_{L3}$ do not vary.

In the erasure operation for cell data, the potential of the N-type well Wn surrounding the P-type independent well Wp is set to Vb_era or a value greater than Vb_era. This is intended to prevent flowing of forward current from the P-type independent well Wp toward the N-type well Wn.

The word lines WL_C0, WL_C1, WL_C2 and WL_C3 are set at the erasure gate potential Vg_era, which is set to a value smaller than Vb_era. Thereby, the trapped electrons in gate insulating films of the MISFETs $M_{R0}$, $M_{R1}$, $M_{R2}$ and $M_{R3}$ are easily released into the P-type independent well Wp. For example, Vg_era is 0 V. It should be noted that the MISFETs $M_{L0}$, $M_{L1}$, $M_{L2}$ and $M_{L3}$, $M_{R0}$, $M_{R1}$, $M_{R2}$ and $M_{R3}$ in the memory cells MC0, MC1, MC2 and MC3 are in the off-state at the erasure gate potential Vg_era.

In the erasure operation for cell data, the ground control line WL_PD is set to the off-potential Voff, at which an N-channel MISFET $T_{PD}$ turns off, and the memory selection line WL_TG and the pre-charge control line WL_PC are set at the off-potential Voff, at which a P-channel MISFET turns off. Furthermore, the sense-amplifier selection lines WL_SA0 and WL_SA1 are set at the hold potential Vhold, at which the sense amplifiers SA0 and SA1 are electrically disconnected from the local bit lines $LBL_L$ and $LBL_R$.

As a result, in the erasure operation for cell data, the local bit lines $LBL_L$ and $LBL_R$ are made in the floating state. Thereby, the source terminals of the MISFETs $M_{L0}$, $M_{L1}$, $M_{L2}$, $M_{L3}$, $M_{R0}$, $M_{R1}$, $M_{R2}$ and $M_{R3}$ is made in the floating state (Vs_era).

The potential Voff of the ground control line WL_PD is, for example, the ground potential Vss at which the MISFET $T_{PD}$ turns off; the off-potential Voff of the memory selection line WL_TG is, for example, a power supply potential Vdd at which the MISFET $T_{TG}$ turns off; and the off-potential Voff of the pre-charge control line WL_PC is the power supply potential Vdd at which the pre-charge circuit PC is made in the nonoperating state. The hold potential Vhold of the sense-amplifier selection lines WL_SA0 and WL_SA1 is the power supply potential Vdd at which the sense amplifiers SA0 and SA1 are electrically disconnected from the local bit lines $LBL_L$ and $LBL_R$.

It should be noted that with respect to the sixth embodiment, it is explained by way of example that Vb_era is 3.3 V, Vd_era is 0 V, Vg_era is 0 V, and Vs_era is in the floating state. However, instead of such a setting, it may be set that Vb_era is 0 V, Vd_era is −3.3 V, Vg_era is −3.3 V, and Vs_era is in the floating state. In this case also, forward current necessary for erasure can be made to flow in the drain of a MISFET to be subjected to the erasure operation.

(Seventh Embodiment)

FIGS. 13-16 are views for explaining a rewrite operation for cell data in a seventh embodiment.

In those figures, $M_L$ and $M_R$ denote a pair of MISFETs in a single memory cell. For example, a pair of MISFETs $M_L$ and $M_R$ correspond to the MISFETs $M_{L0}$ and $M_{R0}$ in the memory cell $M_{L0}$ in each of the first to sixth embodiments.

In the seventh embodiment, in a memory cell to which data is written by a first write operation, the data is overwritten with new data by a second write operation.

Figure 13:
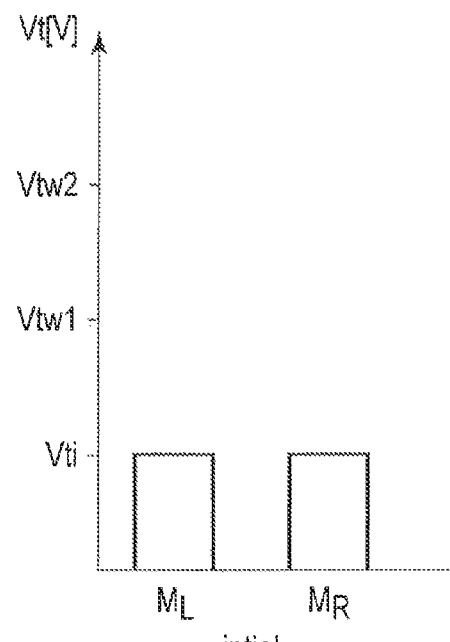

To be more specific, as shown in FIG. 13, when the MISFETs $M_L$ and $M_R$ are in an initial state, they have a first value (initial threshold voltage) Vti. In this state, the first write operation is performed.

Figure 14:
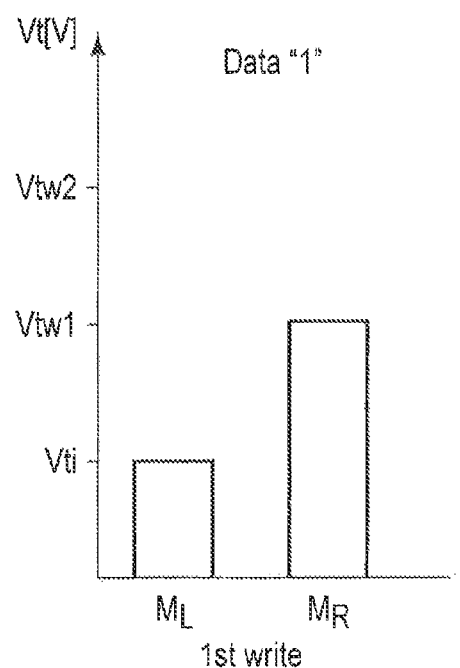

As shown in FIG. 14, by the first write operation, the threshold voltage of the MISFET $M_R$ is changed from the first value to a second value (first write threshold voltage) Vtw1. On the other hand, even after the first write operation, the threshold voltage of the MISFET $M_L$ is kept at the first value Vti. As a result, the threshold voltage Vtw1 of the MISFET $M_R$ becomes greater than the threshold voltage Vti of the MISFET $M_L$, and data "1" is written to the memory cell.

It should be noted that a read potential at the time of reading the data stored in the memory cell by the first write operation is Vsense1. For example, "Vti<Vsense1<Vtw1" is satisfied. Also, Vsense1 may be greater than Vtw1.

Then, the case where the second write operation is performed will be explained.

In the second write operation, the threshold voltage of one of the MISFETs $M_L$ and $M_R$ is changed to a third value (second write voltage) Vtw2 greater than the second value Vtw1. In such a manner, in order that the threshold voltage of one of the MISFETs $M_L$ and $M_R$ be changed to the third value Vtw2, it suffices that for example, a write pulse is applied for a longer time period than a write pulse Vd_prg for use in the first write operation or a write pulse having an applied voltage higher than an applied voltage of the pulse Vd_prg for use in the first write operation is applied.

For example, as shown in FIG. 15, in the case where data "1" as shown in FIG. 14 is overwritten with data "0", the threshold voltage of the MISFET $M_R$ is kept at the second value (first write threshold voltage) Vtw1, and the threshold voltage of the MISFET $M_L$ is changed from the first value (initial threshold voltage) to the third value (second write voltage) Vtw2.

On the other hand, as shown in FIG. 16, in the case where data "1" as shown in FIG. 14 is further overwritten with data "1", the threshold voltage of the MISFET $M_R$ is changed form the second value (first write voltage) to the third value (second write voltage) Vtw2, and the threshold voltage of the MISFET $M_L$ is kept at the first value (initial threshold voltage).

It should be noted that the read potential at the time of reading data stored in the memory cell by the above second write operation is Vsense2. For example, "Vtw1<Vsense2<Vtw2" is satisfied. In this case, cases as shown in FIGS. 15 and 16 can be handled.

Furthermore, it is preferable that Vsense2 be greater than Vsense1. This is because if Vsense2 be greater than Vsense1, the read speed in such cases as shown in FIGS. 15 and 16 can be increased.

For example, with respect to the MISFETs $M_R$ and $M_L$ in the memory cell, the threshold voltage of one having a lower threshold voltage is Vlow. Read current is determined in accordance with a gate overdrive voltage Vsense2-Vlow. In the case as shown in FIG. 15, after the second write operation, the threshold voltage Vlow of the MISFET $M_R$ is the second value (first write threshold voltage) Vtw1. In this case, if the value of Vsense2 is small, the gate overdrive voltage Vsense2-Vlow is made small, and as a result the read speed is low. On the other hand, if Vsense2 is made greater than Vsense1, for example, the gate overdrive voltages Vsense1-Vlow (FIG. 14) and Vsense2-Vlow (FIG. 15) can be kept constant, and it is therefore possible to avoid lowering of the read speed.

(Application Example)

In the reconfigurable logic circuit, the configuration data output terminal (OUT) is connected to, for example, a control terminal of a pass transistor (e.g., a gate terminal of an FET). The pass transistor serves to selectively interconnect logic elements for achieving a predetermined logic (circuit configuration). However, there is also a case where a single output node OUT is connected to gate terminals of a plurality of pass transistors.

Programmable circuit elements applied to the configuration memories according to the first to seventh embodiments will be explained.

FIG. 17 shows an example of a programmable switch.

An output node OUT of a configuration memory MCM is connected to a gate electrode of a MISFET in a logic unit 10. This MISFET is referred to as a pass transistor, and determines whether to transfer or shut out an input signal ΦIN on the basis of configuration data.

In this application example, the output node OUT is connected to the gate electrode of a single pass transistor; however, it may be connected in common to the gate electrodes of a plurality of pass transistors.

Furthermore, the pass transistor may be of either an N-channel type or a P-channel type.

Also, the output node OUT may be connected to an input terminal of an inverter.

In an example as shown in FIG. 18, an output node OUT of a configuration memory MCM is connected to one of a source and a drain of a MISFET in a logic unit 10.

This MISFET is provided as, e.g., part of a look-up table (LUT), and determined whether to output configuration data or not on the basis of a control signal φ1.

In the above example, the output node OUT is connected to the source or drain of a single switch transistor; however, it may be connected in common to sources or drains of a plurality of switch transistors. Furthermore, the switch transistor may be of either an N-channel type or a P-channel type.

(Conclusion)

According to each of the above embodiments, it is possible to achieve a configuration memory provided with nonvolatile memory cells each having a small cell area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A configuration memory comprising:
   first and second bit lines;
   a first memory cell including first and second MISFETs, each of the first and second MISFETs having a source, a drain, a gate and a gate insulating layer, one of the source and the drain of the first MISFET being connected to the first bit line, the gate of the first MISFET being connected to a first word line, one of the source and the drain of the second MISFET being connected to the second bit line, the gate of the second MISFET being connected to the first word line;

a second memory cell including third and fourth MISFETs, each of the third and fourth MISFETs having a source, a drain, a gate and a gate insulating layer, one of the source and the drain of the third MISFET being connected to the first bit line, the gate of the third MISFET being connected to a second word line, one of the source and the drain of the fourth MISFET being connected to the second bit line, the gate of the fourth MISFET being connected to the second word line;

a first sense amplifier connected to the first and second bit lines, and including a first output terminal;

a first conductive line connected to the other of the source and the drain of the first MISFET and the other of the source and the drain of the third MISFET;

a second conductive line connected to the other of the source and the drain of the second MISFET and the other of the source and the drain of the fourth MISFET;

a second sense amplifier connected to the first and second bit lines, and including a second output terminal;

a multiplexer including a first input terminal connected to the first output terminal, a second input terminal connected to the second output terminal and a third output terminal; and a control circuit configured to write data to the first memory cell by setting the first word line at a first potential at which the first MISFET turns on, setting the first conductive line at a second potential higher than the first potential, injecting carriers into the gate insulating layer of the first MISFET to change a threshold voltage of the first MISFET from the first value to the second value, and not to change threshold values of the second to fourth MISFETs from the first value to the second value.

2. The memory of claim 1, wherein:

first data in the first memory cell is held by the first sense amplifier in a first cycle;

second data in the second memory cell is held by the second sense amplifier in a second cycle subsequent to the first cycle;

the first data held by the first sense amplifier is output from the third output terminal in the second cycle; and the second data held by the second sense amplifier is output from the third output terminal in a third cycle subsequent to the second cycle.

3. A programmable switch comprising:

the configuration memory of claim 1; and a pass transistor having a gate connected to the third output terminal of the multiplexer.

\* \* \* \* \*